US012072379B2

(12) United States Patent
Chakrabarty et al.

(10) Patent No.: US 12,072,379 B2
(45) Date of Patent: Aug. 27, 2024

(54) DYNAMIC SCAN OBFUSCATION FOR INTEGRATED CIRCUIT PROTECTIONS

(71) Applicant: Duke University, Durham, NC (US)

(72) Inventors: Krishnendu Chakrabarty, Durham, NC (US); Jonti Talukdar, Durham, NC (US); Arjun Chaudhuri, Durham, NC (US)

(73) Assignee: DUKE UNIVERSITY, Durham, NC (US)

( * ) Notice: Subject to any disclaimer, the term of this patent is extended or adjusted under 35 U.S.C. 154(b) by 233 days.

(21) Appl. No.: 17/693,942

(22) Filed: Mar. 14, 2022

(65) Prior Publication Data

US 2023/0288477 A1 Sep. 14, 2023

(51) Int. Cl.
  *G01R 31/3177* (2006.01)
  *G01R 31/317* (2006.01)
  *G06F 11/263* (2006.01)

(52) U.S. Cl.
  CPC ..... *G01R 31/3177* (2013.01); *G01R 31/31703* (2013.01); *G06F 11/263* (2013.01); *G06F 2201/83* (2013.01)

(58) Field of Classification Search
  CPC .......... G01R 31/3177; G01R 31/31703; G01R 31/318566; G01R 31/318588; G06F 11/263; G06F 2201/83
  See application file for complete search history.

(56) References Cited

U.S. PATENT DOCUMENTS

| 6,259,789 B1 * | 7/2001 | Paone .................. H04L 9/3247 713/189 |
| 9,041,411 B2 * | 5/2015 | Marinissen ...... G01R 31/31719 324/537 |
| 10,748,038 B1 * | 8/2020 | Raichelgauz ........... G06F 18/22 |
| 10,788,532 B2 * | 9/2020 | Deutsch ................. G11C 29/44 |
| 10,902,098 B2 * | 1/2021 | Zhou ...................... G06F 21/14 |
| 11,611,429 B2 * | 3/2023 | Tehranipoor .............. H04L 9/14 |
| 2002/0186838 A1 * | 12/2002 | Brandys ................ H04L 9/3263 713/185 |
| 2003/0145225 A1 * | 7/2003 | Bruton, III .......... H04L 63/1408 726/23 |

(Continued)

FOREIGN PATENT DOCUMENTS

EP  1089083 A1 *  4/2001  ....... G01R 31/31701

OTHER PUBLICATIONS

Design Protection Using Logic Encryption and Scan-Chain Obfuscation Techniques Deepak, V A; Priyatharishini, M; Nirmala Devi, M. International Journal of Electronics and Telecommunications 65.3: 389-396. Warsaw: Polish Academy of Sciences. (2019) (Year: 2019).*

(Continued)

*Primary Examiner* — Michael Won
(74) *Attorney, Agent, or Firm* — Talem IP Law, LLP (57) ABSTRACT

An integrated circuit (IC) protection circuit can include a reconfigurable block that receives a seed value from a tamper-proof memory and generates a dynamic key; an authentication block that receives the dynamic key from the reconfigurable block and taint bits from a scan chain to generate an authentication signature; and an encryptor that encrypts a test pattern response on the scan chain if a mismatch is found between the authentication signature and a test pattern embedded signature.

20 Claims, 9 Drawing Sheets

(56) References Cited

U.S. PATENT DOCUMENTS

| | | | |
|---|---|---|---|
| 2003/0145226 A1* | 7/2003 | Bruton, III | H04L 63/0263 709/224 |
| 2004/0025027 A1* | 2/2004 | Balard | G06F 21/31 713/183 |
| 2004/0210566 A1* | 10/2004 | Smith | G06Q 20/355 |
| 2005/0038787 A1* | 2/2005 | Cheung | G06F 16/951 707/999.009 |
| 2005/0063570 A1* | 3/2005 | Kim | G07C 9/247 382/119 |
| 2006/0136744 A1* | 6/2006 | Lange | G06V 40/10 713/186 |
| 2007/0038911 A1* | 2/2007 | Koenemann | G01R 31/31703 714/732 |
| 2007/0234169 A1* | 10/2007 | Rajski | G01R 31/31723 714/742 |
| 2008/0045342 A1* | 2/2008 | Crowder, Jr. | G06F 9/4403 717/176 |
| 2008/0240447 A1* | 10/2008 | Zhu | H04L 9/3271 380/30 |
| 2009/0147945 A1* | 6/2009 | Doi | H04L 9/002 380/2 |
| 2010/0223515 A1* | 9/2010 | Nieuwland | G01R 31/318541 714/E11.155 |
| 2010/0311482 A1* | 12/2010 | Lange | A61B 5/35 340/5.82 |
| 2011/0099384 A1* | 4/2011 | Grange | H04L 9/3234 713/184 |
| 2013/0166977 A1* | 6/2013 | Pugliesi-Conti | G06K 19/07363 714/727 |
| 2014/0340112 A1* | 11/2014 | Tehranipoor | H04L 9/0869 326/8 |
| 2015/0316605 A1* | 11/2015 | Deutsch | G11C 29/56004 702/117 |
| 2018/0159681 A1* | 6/2018 | Molter | H04L 9/0643 |
| 2019/0165935 A1* | 5/2019 | Tehranipoor | H04L 9/14 |
| 2020/0204373 A1* | 6/2020 | Lu | H04L 9/3239 |
| 2022/0317186 A1* | 10/2022 | Re Fiorentin | G01R 31/318536 |

OTHER PUBLICATIONS

Securing Cryptographic Chips against Scan-Based Attacks in Wireless Sensor Network Applications Wang, WeiZheng; Deng, Zhuo; Wang, Jin; Sangaiah, Arun Kumar; Cai, Shuo; et al. Sensors 19.20: 4598. Basel: MDPI AG. (2019) (Year: 2019).*

Bogdanov, Andrey et al., "Present: An ultra-lightweight block cipher," Cryptographic Hardware and Embedded Systems-CHES 2007: Lecture Notes in Computer Science, Sep. 2007, pp. 450-466, vol. 4727, Springer, Berlin, Heidelberg.

Tan, Benjamin et al., "Benchmarking at the Frontier of Hardware Security: Lessons from Logic Locking," Jun. 11, 2020, 16 pages, arXiv.

Chakraborty, Abhishek et al., "Keynote: A Disquisition on Logic Locking," IEEE Transactions on Computer-Aided Design of Integrated Circuits and Systems, Oct. 2020 (Accessible Sep. 30, 2019), pp. 1952-1972, vol. 39, issue 10, IEEE.

Limaye, Nimisha, et al., "Thwarting All Logic Locking Attacks: Dishonest Oracle With Truly Random Logic Locking," IEEE Transactions on Computer-Aided Design of Integrated Circuits and Systems, Sep. 2021 (accessible Oct. 6, 2020), pp. 1740-1753, vol. 40, issue 9, IEEE.

Azar, Kimia Zamiri et al., "From Cryptography to Logic Locking: A Survey on the Architecture Evolution of Secure Scan Chains," IEEE Access, May 24, 2021 (Accessible May 14, 2021), pp. 73133-73151, vol. 9, IEEE.

Limaye, Nimisha, et al., "DynUnlock: Unlocking Scan Chains Obfuscated using Dynamic Keys," 2020 Design, Automation Test in Europe Conference Exhibition, Mar. 2020, pp. 270-273, IEEE, Grenoble, France.

Alrahis, Lilas et al., "ScanSAT: Unlocking Static and Dynamic Scan Obfuscation," IEEE Transactions on Emerging Topics in Computing, Sep. 13, 2019 (Accessible Sep. 10, 2019), pp. 1867-1882, vol. 9, issue 4, IEEE.

Lee, J et al., "A Low-Cost Solution for Protecting IPs Against Scan-Based Side-Channel Attacks," 24th IEEE VLSI Test Symposium, May 2006, pp. 94-99, IEEE, Berkeley, CA, USA.

Razzaq, Mohammed Abdul et al., "SSTKR: Secure and Testable Scan Design through Test Key Randomization," 2011 Asian Test Symposium, Nov. 2011, pp. 60-65, IEEE, New Delhi, India.

Zhang, Dongrong et al., "Dynamically obfuscated scan for protecting IPs against scan-based attacks throughout supply chain," 2017 IEEE 35th VLSI Test Symposium (VTS), May 18, 2017 (Accessible Apr. 2017), pp. 1-6, IEEE, Las Vegas, NV, USA.

Karmakar, Rajit et al., "A Scan Obfuscation Guided Design-for-Security Approach for Sequential Circuits," IEEE Transactions on Circuits and Systems II: Express Briefs, Mar. 2020 (Accessible May 8, 2019), pp. 546-550, vol. 67, issue 3, IEEE.

Da Silva, Mathieu et al., "Preventing Scan Attacks on Secure Circuits Through Scan Chain Encryption," IEEE Transactions on Computer-Aided Design of Integrated Circuits and Systems, Mar. 2019 (Accessible Mar. 23, 2018), pp. 538-550, vol. 38, issue 3, IEEE.

Dworkin, Morris, "Recommendation for block cipher modes of operation: The CCM mode for authentication and confidentiality," NIST Special Publication 800-38C, May 2004, 26 pages, NIST, Gaithersburg, MD.

Sahai, Amit et al., "How to use indistinguishability obfuscation: deniable encryption, and more," Proceedings of the Forty-Sixth Annual ACM Symposium on Theory of Computing, May 31, 2014, 39 pages, ACM, New York, New York.

Matsui, Mitsuru, "Linear cryptanalysis method for DES cipher," Workshop on the Theory and Application of of Cryptographic Techniques, Lecture Notes in Computer Science, May 1993, pp. 386-397, vol. 765, Springer, Berlin, Heidelberg.

Talukdar, Jonti, et al., "A BIST-based Dynamic Obfuscation Scheme for Resilience against Removal and Oracle-guided Attacks," 2021 IEEE International Test Conference (ITC), Oct. 2021, pp. 170-179, IEEE, Anaheim, CA.

Rajski, J et al., "Embedded Deterministic Test," IEEE Transactions on Computer-Aided Design of Integrated Circuits and Systems, May 4, 2004, pp. 776-792, vol. 23, issue 5, IEEE.

* cited by examiner

- Example:
  - $q = 4$ bits
  - $t = 6 \times q;\quad (k_1, k_2) = 3 \times q;\quad (k_3, k_4) = q$ $$T = [1011\ 0001\ 1011\ 1011\ 1101\ 0100]$$

$$k_1 = [1100\ 0010\ 1111],$$
$$k_2 = [0101\ 0110\ 1010],$$
$$k_3 = [0111],$$
$$k_4 = [1001]$$

$$S = [0100]$$

$$k_{encr} = [1100]$$

DYNAMIC SCAN OBFUSCATION FOR INTEGRATED CIRCUIT PROTECTIONS

GOVERNMENT SUPPORT

This invention was made with government support under Federal Grant No. CNS-2011561 awarded by the National Science Foundation. The government has certain rights in the invention.

BACKGROUND

The rapid globalization of the integrated circuit (IC) supply chain has resulted in the outsourcing of fabrication and testing operations to third parties. These third parties are considered untrusted parties or entities because they have access to the intellectual property relevant to an IC design but are not the originating entity of that intellectual property and therefore are a potential risk for malevolent actions. Indeed, this outsourced manufacturing flow poses significant risk to the security of intellectual property as it becomes exposed to malevolent untrusted third parties who may change the design, try to steal the information, counterfeit or overbuild the IC, or insert hardware Trojans in the design.

Logic locking is an approach to protect the integrity of a design through the fabrication and testing process. In general, logic locking works by using "locking logic" that is inserted into a design that allows for unlocking of functionality upon the application of the correct key. Combinational locking techniques insert key gates into the design, while sequential locking techniques insert obfuscation states and state transitions to prevent an adversary from accessing the correct order of functional states. However, powerful satisfiability (SAT)-based oracle-guided attacks are capable of rapidly pruning the key-search space to extract the correct key. Indeed, if a malicious entity wants to gain access to the internals of the circuit, they may use the scan chain to feed in bits and extract the responses of the circuit. Thus, there continues to be a need for protective measures for integrated circuits.

BRIEF SUMMARY

Integrated circuit (IC) protections using dynamic scan obfuscation are described. Scan chain protections are provided that can be incorporated with a logic locking approach to protect against design theft, including by oracle-guided and oracle-free attacks.

An IC protection circuit can include a reconfigurable block that receives a seed value from a tamper-proof memory and generates a dynamic key; an authentication block that receives the dynamic key from the reconfigurable block and taint bits from a scan chain to generate an authentication signature; an encryptor that encrypts a test pattern on the scan chain if a mismatch is found between the authentication signature and a test pattern embedded signature; and a comparator that is coupled to receive the authentication signature from the authentication block and the test pattern embedded signature from the scan chain and output a signal to the encryptor that indicates whether or not there is the mismatch between the authentication signature and the test pattern embedded signature. One or more multiplexors (MUXs) can be included coupled to the scan chain to select bits corresponding to the test pattern embedded signature to output the test pattern embedded signature to the comparator.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Integrated circuit (IC) protections using dynamic scan obfuscation are described. Scan chain protections are provided that can be incorporated with a logic locking approach to protect against design theft, including by oracle-guided and oracle-free attacks. The described techniques can secure the signal path of the IC chip that goes through the scan chains to protect the logic from being reverse engineered or otherwise accessed. For example, a scan obfuscation scheme is provided that can authenticate whether the scan access is being performed by a trusted user and can obfuscate the scan data in case the scan chains are being accessed by an untrusted user.

Figure 1:
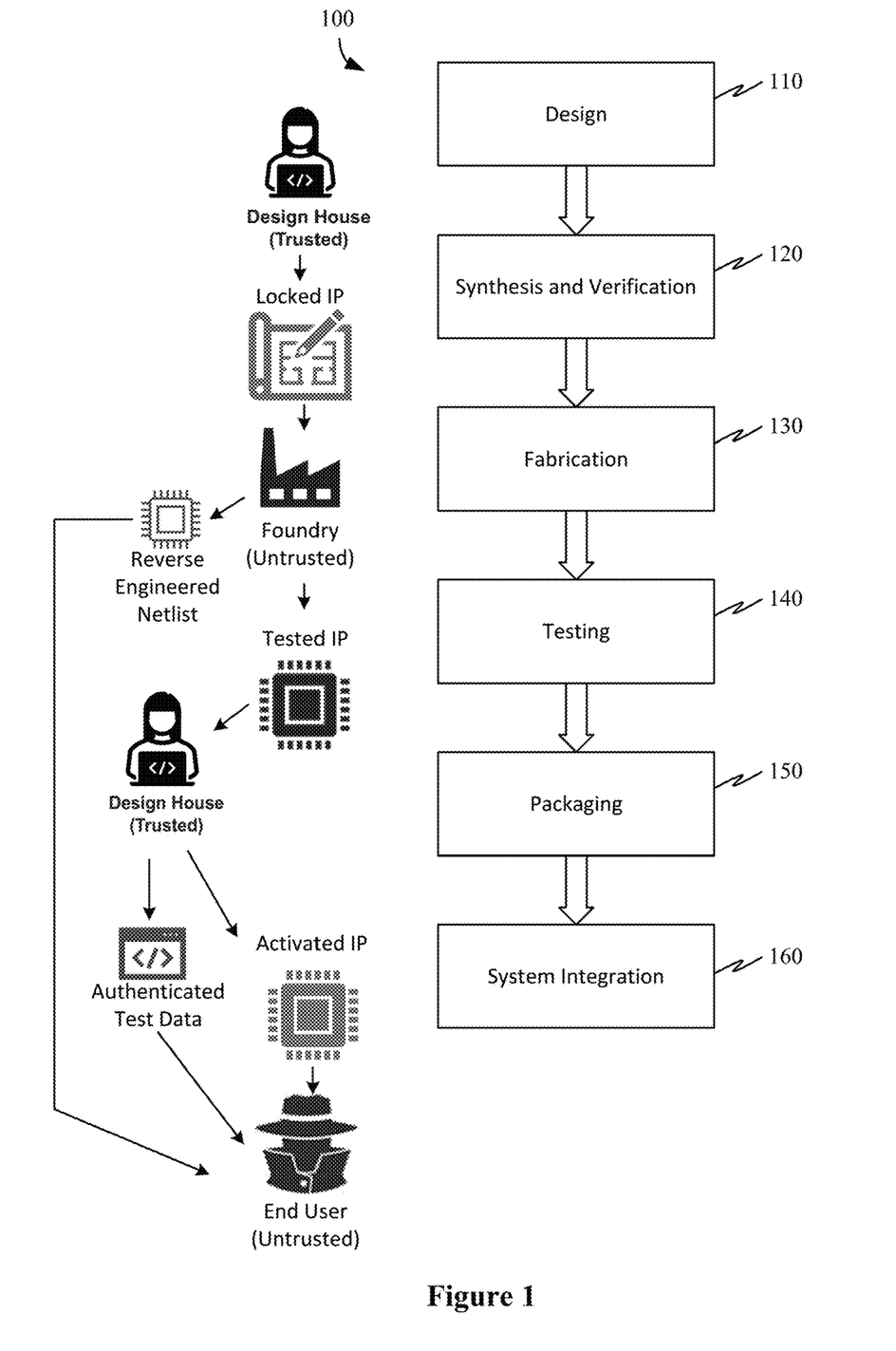
FIG. 1 illustrates areas for hardware security and hardware trust of a design and manufacturing flow.

FIG. 1 illustrates areas for hardware security and hardware trust of a design and manufacturing flow. With the semiconductor supply chain distributed across the globe, there are multiple untrusted entities working and contributing towards the different steps of a design and manufacturing flow. These entities include, but are not limited to, tool vendors, foundry, test and distribution facilities, and computer assisted design tools (such as for netlist extraction). Hardware security issues arise from a hardware's own vulnerability to different types of attacks at different levels (e.g., design stage, chip fabrication stage, and system integrated such as when integrated on a printed circuit board (PCB)). Hardware Trust arises from the involvement of untrusted entities in the hardware lifecycle itself.

There are a number of levels of threats to the IC design, including oracle-based attacks and oracle-free attacks. A threat model for an oracle-based attack includes having access to the reverse-engineered netlist (obtained from layout) and access to functionally operational oracle (e.g., procured from the market). Oracle-based attacks generally refer to attacks where inputs are applied to a system in order to result in outputs (direct or indirect) from which the underlying algorithm or secret information can be obtained. Access to the reverse-engineered netlist allows an attacker to analyze and bypass built-in defenses to unlock the circuit design. Access to the functionally operational oracle allows an attacker to obtain correct input/output response pairs for the design under attack. Popular oracle-based attacks include SAT-attack (and its enhancements) and sequential SAT. SAT refers to a Boolean Satisfiability based attack or "satisfiability". Popular oracle-free attacks aim to remove protection elements from the circuit through netlist analysis, signal probability skew measures, identifying redundancies in the design, etc.

The dynamic scan obfuscation described herein can be used with logic locking to provide various levels of security against multiple untrusted environments, including at an integrator, foundry, test facility, and at the end user. Referring to FIG. 1, a design flow and lifecycle 100 can involve design 110, synthesis and verification 120, fabrication 130, testing 140, packaging 150, and system integration 160 (and reuse).

Design 110 can involve in-house design teams and integration teams that integrate designs from the in-house design teams and designs that may be provided by different vendors. Here, the untrusted party may be the integrator. Certain IC protections against removal and oracle-guided attacks can be applied at the design 110 stage (prior to integration) and incorporated into the register-transfer level (RTL) netlist to assist with vulnerabilities at later stages of the design flow and lifecycle 100.

Synthesis and verification 120 can begin upon receipt of the RTL netlist from the design integration of the design 110 stage; and includes RTL verification, logic synthesis, gate-level netlist generation, physical synthesis, layout generation, and layout verification, among other processes. Certain IC protections against removal and oracle-guided attacks can be applied at the synthesis and verification 120 stage. For example, automated place and route processes can be used to integrate/distribute the hardware circuitry/logic of the IC protection architecture described herein with the circuit design of the circuit to be protected. Indeed, features of the IC protection architecture described herein can be synthesized together with the circuit design, making it harder for an entity to identify the IC protection architecture for a removal type of attack.

The layout/tapeout files are then sent to a foundry for fabrication 130 of wafers. The technology can be considered locked since certain aspects may be unavailable even with a reverse engineered netlist. The foundry may be an untrusted party. The wafers are tested as part of the testing 140 stage; and a third untrusted party (e.g., test facility) may be responsible for testing, packaging, and assembly carried out as part of the packaging 150 stage. In some cases, a trusted design house can confirm authenticated test data and support activating the technology. System integration 160 may be carried out by yet another untrusted party (who could be considered the end-user) and involve incorporating the packaged IC chip (from the packaging 150 stage) into a PCB assembly, which may include outdated systems, be part of recycling/repackaging, or include "out-of-spec" ICs. The IC protection architecture described herein can be used to protect against certain risks at these post-tapeout stages such that even if a bad actor at or associated with one of the untrusted entities have access to the actual chip, the chip cannot be used—even with reverse engineering—because the design is locked and/or signals obfuscated. That is, a goal of various implementations of the described IC protection architecture is to lock the scan chains in such a way that only an authorized user will be able to functionally unlock the design.

Figure 2:
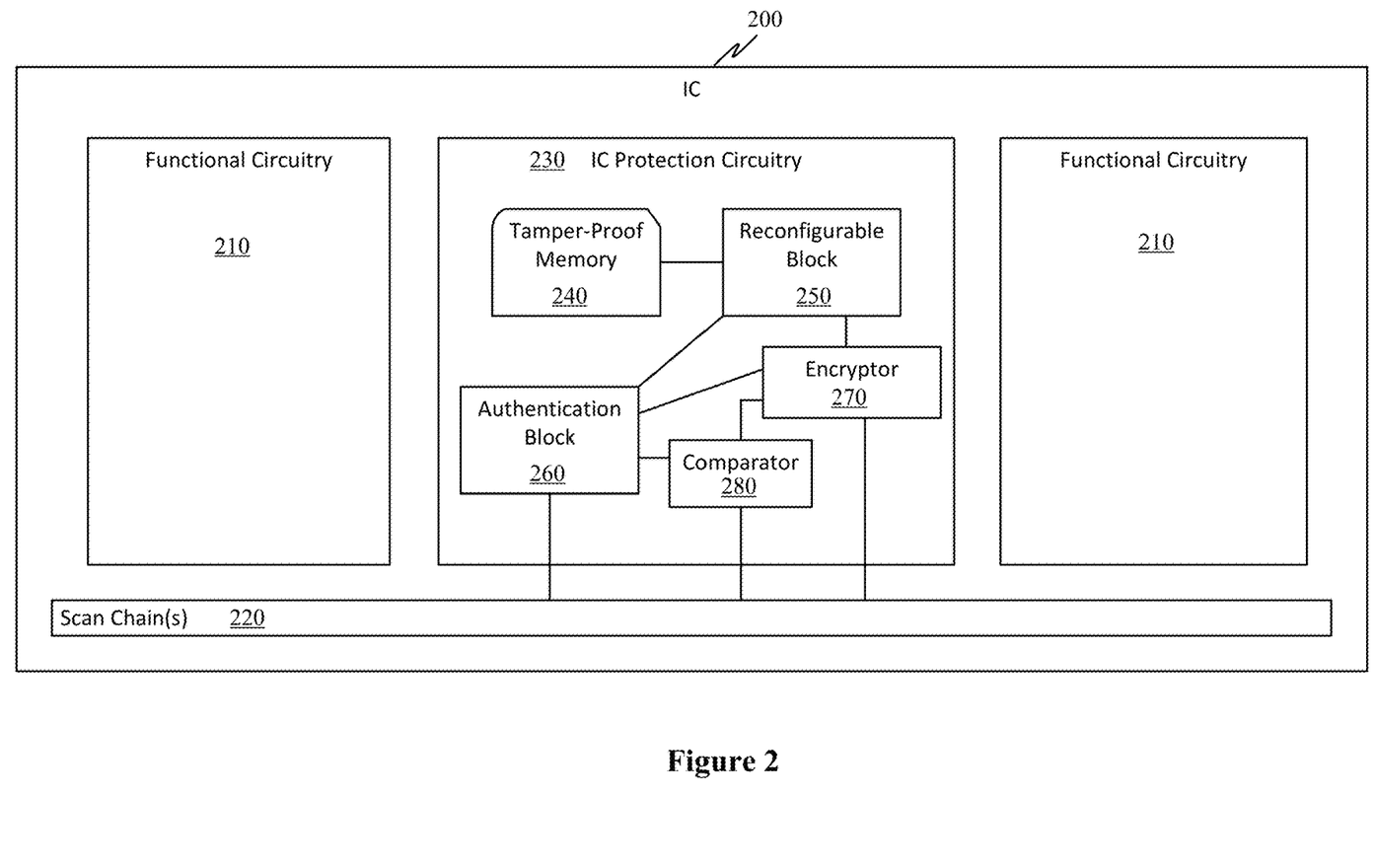
FIG. 2 illustrates an overview of an integrated circuit with IC protection circuitry.

FIG. 2 illustrates an overview of an integrated circuit with IC protection circuitry. Referring to FIG. 2, an IC chip 200 can include functional circuitry 210, built-in self-test (BIST) circuitry including scan chains 220, and IC protection circuitry 230 including an IC protection architecture as described herein.

As illustrated, the IC protection circuitry 230 can include a reconfigurable block 240 that receives a seed value from a tamper-proof memory 250 and generates a dynamic key; an authentication block 260 that receives the dynamic key from the reconfigurable block 240 and taint bits from the scan chain 220 to generate an authentication signature; an encryptor 270 that encrypts a test pattern response on the scan 220 chain if a mismatch is found between the authentication signature and a test pattern embedded signature; and a comparator 280 that is coupled to receive the authentication signature from the authentication block 260 and the test pattern embedded signature from the scan chain 220 and output a signal to the encryptor 270 that indicates whether or not there is the mismatch between the authentication signature and the test pattern embedded signature.

As both trusted and untrusted entities may have scan access, authentication is performed on a per-pattern basis; and scan responses for unauthenticated test patterns are encrypted. The IC protection architecture, such as represented by IC protection circuit 200 can implement a cryptographically secure dynamic scan data authentication and encryption scheme that performs dynamic per-pattern authentication while achieving secure dynamic obfuscation (through encryption) for unauthorized users using taint bits embedded in the test pattern.

Figure 3:
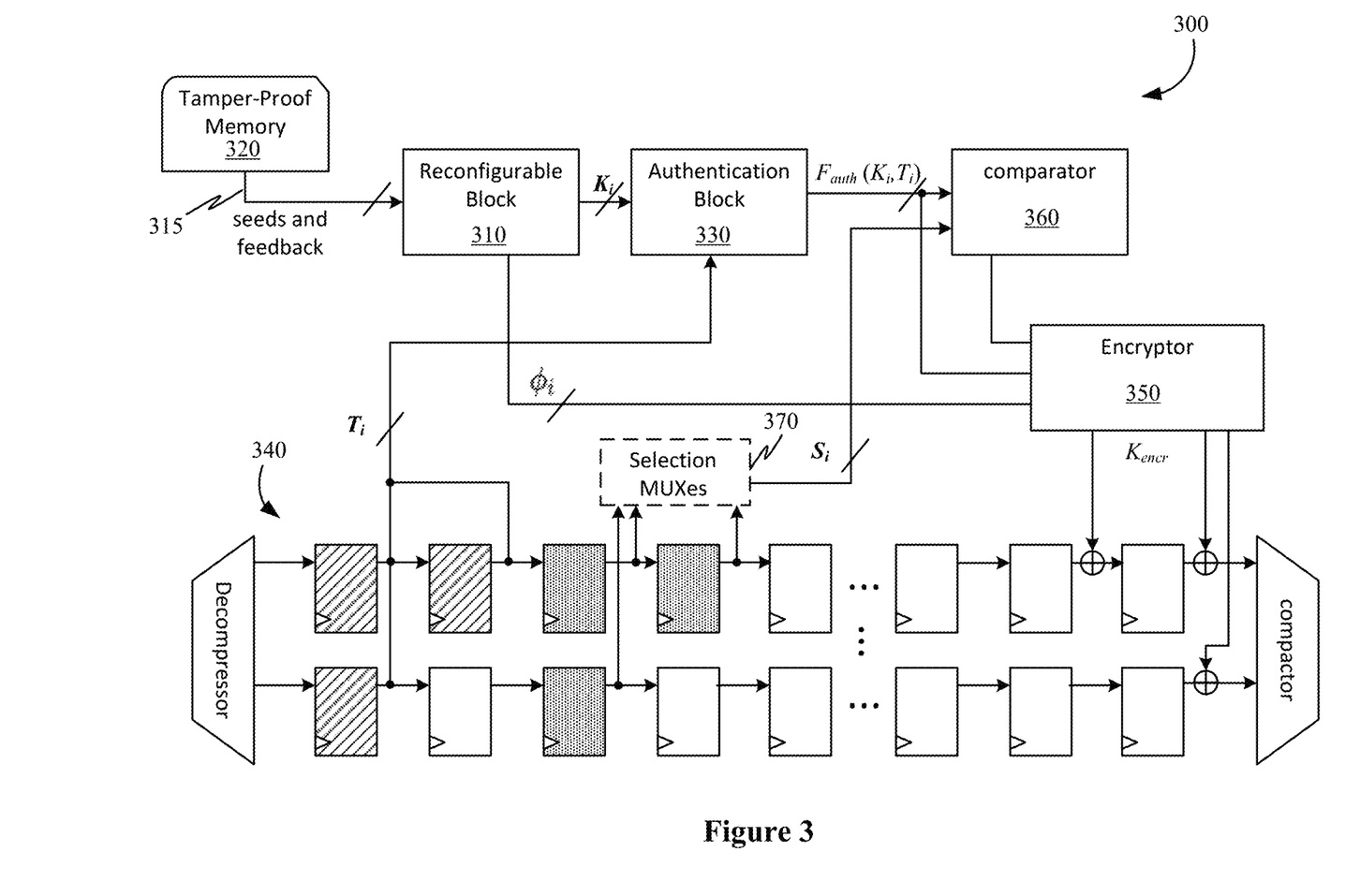
FIG. 3 illustrates an IC protection circuit for dynamic scan obfuscation.
Figure 4:
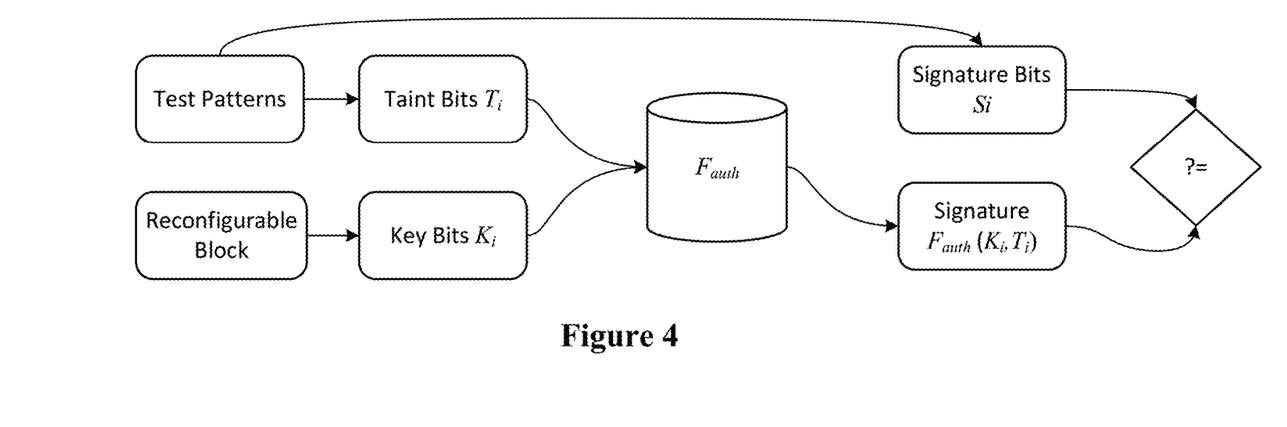
FIG. 4 illustrates a dynamic authentication approach for dynamic scan obfuscation.

FIG. 3 illustrates an IC protection circuit for dynamic scan obfuscation; and FIG. 4 a dynamic authentication approach for dynamic scan obfuscation.

Referring to FIG. 3, an example implementation of the described IC protection architecture is shown. As described with respect to FIG. 2, an IC protection circuit 300 includes a reconfigurable block 310 that receives a seed value 315 from a tamper-proof memory 320 and generates a dynamic key $K_i$. The reconfigurable block 310 can include a reconfigurable feedback and linear-feedback shift register (LFSR), which is initialized using the seed value 315 from the tamper-proof memory 320. The reconfigurable block 310 can generate multiple keys such that the key can be updated for each pattern. The trusted entity is given the information so that for a given pattern, the trusted entity knows the correct key and can embed the appropriate bits in the test pattern message (as described with respect to FIG. 5A). In some cases, the reconfigurable block 310 can be implemented as described with respect to FIGS. 6A and 6B. An authentication block 330 receives the dynamic key(s) $K_i$ from the reconfigurable block 310 and taint bits $T_i$ from a scan chain 340 to generate an authentication signature ($F_{auth}$). That is, as illustrated in FIG. 4, taint bits can be obtained from test patterns input to the scan chain and keys can be obtained from a reconfigurable block to generate an authentication signature $F_{auth}$. The authentication signature $F_{auth}$ is then compared to signature bits of a test pattern embedded signature $S_i$ that is obtained from the test patterns input to the scan chain. An example implementation of the authentication block 330 is shown in FIG. 7.

Returning to FIG. 3, IC protection circuit 300 further includes an encryptor 350 that encrypts a test pattern response on the scan 340 chain if a mismatch is found between the authentication signature ($F_{auth}$) and the test pattern embedded signature $S_i$. The encryptor is able to encrypt the test data (e.g., test pattern response) being shifted through the scan chains. Indeed, because test patterns are shifted in serially, as a previous test pattern response is being encrypted and shifted out, the new incoming test pattern will also start to get encrypted as it is shifted in serially, assuming that the incoming test pattern also passes through some XOR gates in the scan path (shown as ⊕ in FIG. 3). In some cases, encryptor 350 may be implemented as described with respect to FIG. 8.

Figure 9:
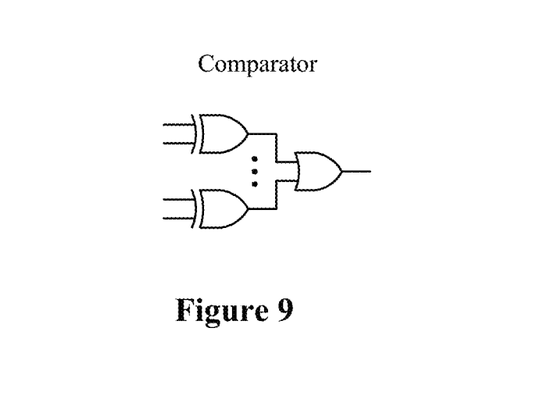
FIG. 9 shows an example comparator.

A comparator 360 is included that is coupled to receive the authentication signature ($F_{auth}$) from the authentication block 330 and the test pattern embedded signature $S_i$ from the scan chain 340 and outputs a signal 365 to the encryptor 350 that indicates whether or not there is the mismatch between the authentication signature ($F_{auth}$) and the test pattern embedded signature $S_i$. In some cases, comparator 360 can be implemented as shown in FIG. 9. In case the size of the test pattern embedded signature is larger than the size of the comparator 280, it is possible to further include a hash function component so that the test pattern embedded signatures and the authentication signatures are passed through a hash function and the smaller signatures are compared by the comparator 360.

As will be discussed in more detail with respect to FIGS. 5A and 5B, one or more multiplexors (MUXs) 370 can be included coupled to the scan chain 340 to select bits corresponding to the test pattern embedded signature to output the test pattern embedded signature $S_i$ to the comparator 360.

As can be seen, a challenge-response authentication mechanism is used to validate the authenticity of each test pattern. The challenge-response authentication mechanism uses dynamically changing keys that are generated cryptographically and on the fly from the taint bits embedded in each test pattern. The keys used for authentication and encryption change based on the pattern and on the order in which the pattern is scanned in. Since the described IC protection architecture can be integrated with a low-overhead high output-corruptibility logic locking schemes, the resulting IC is resilient against not only oracle-guided attacks but also against oracle-free attacks, including removal/bypass attacks.

Figure 5A:
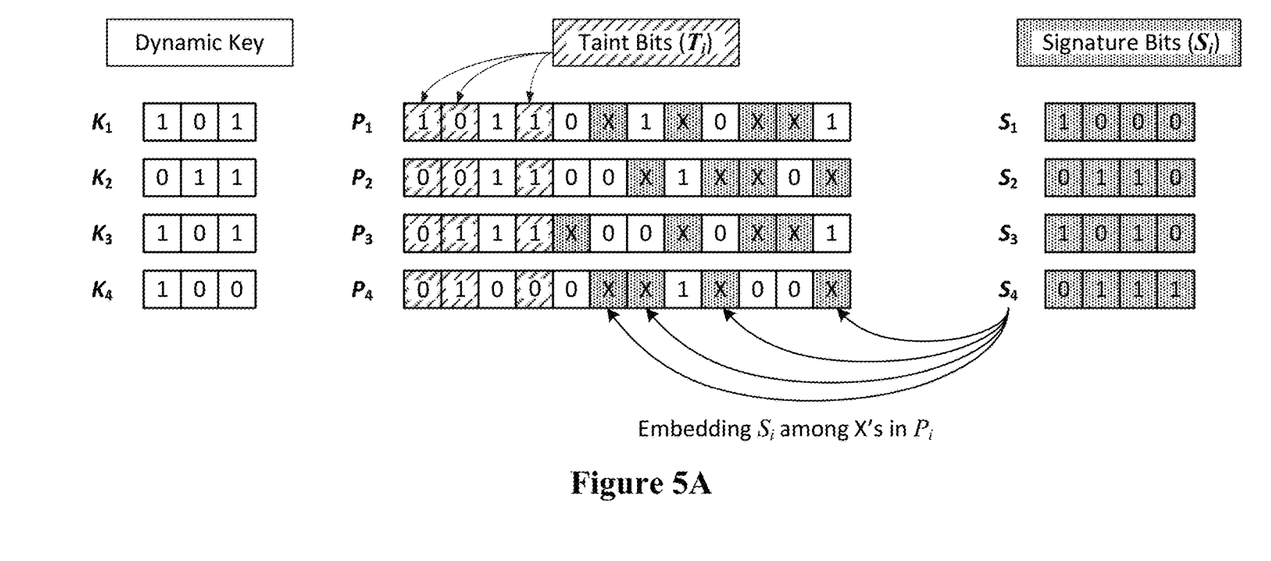
FIGS. 5A and 5B illustrate test pattern generation for embedding authentication data in test patterns.
Figure 5B:
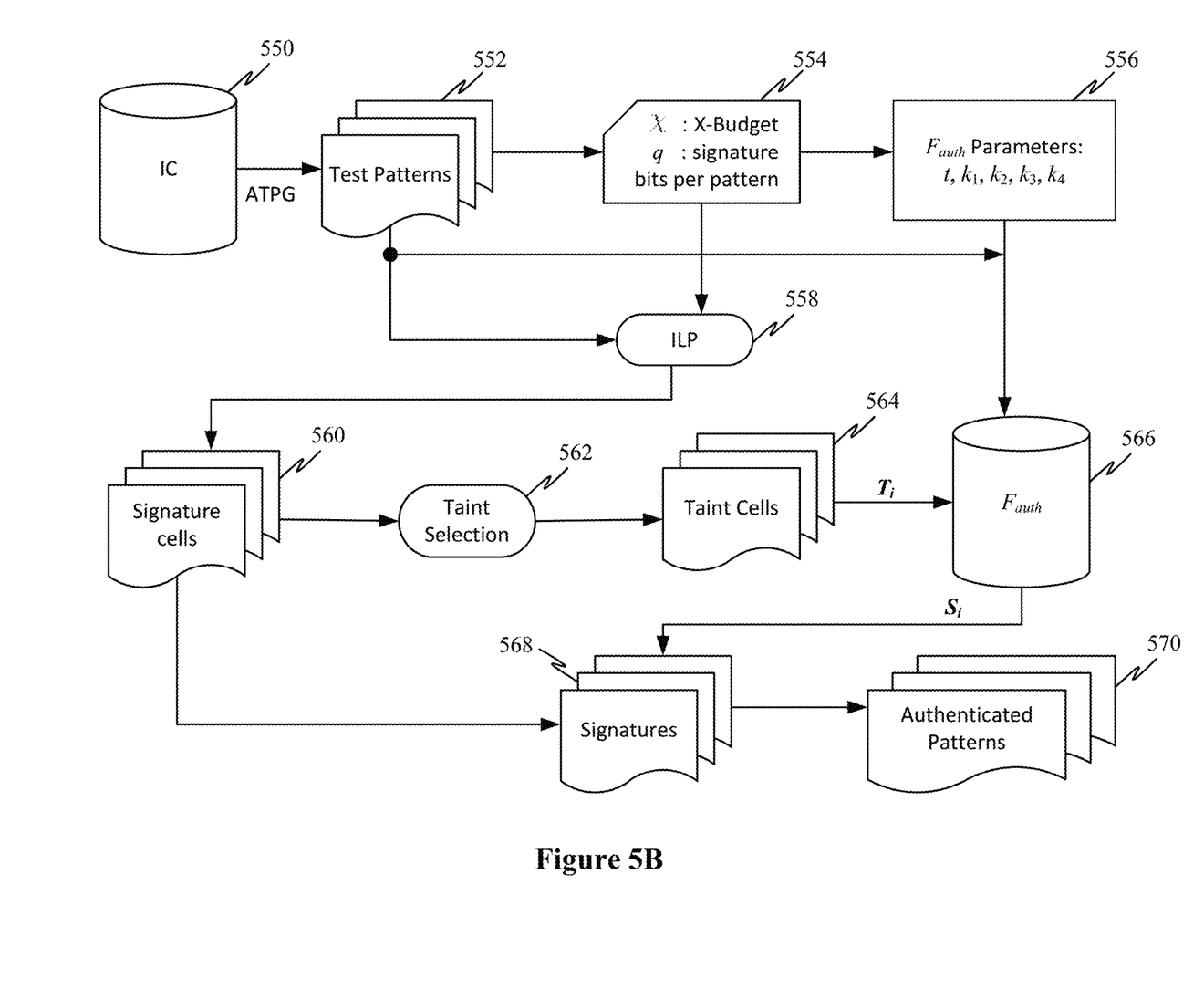

FIGS. 5A and 5B illustrate test pattern generation for embedding authentication data in test patterns. Authentication data is embedded with the message that is transferred/transmitted into the scan along with the scan bits themselves. That is, a test pattern message that is input to a chip for performing automated testing by automated test equipment includes at least the test pattern (for functional and fault testing) and bits used for authentication. As mentioned above, the bits used for authentication include the taint bits and the test pattern embedded signature (also referred to herein as "signature bits"). The test pattern message can include designated bits (e.g., particular locations) that are allocated for storing authentication and/or utilize don't care bits.

Because test patterns are very targeted, often there are several don't care bits in the generated test patterns. These don't care bits can be leveraged for inclusion of embedded authentication information. In a specific implementation as described herein, these don't care bits are used to embed the signature bits while the taint bits are stored in designated bits. The bits stored in the designated bits are incorporated in a test pattern generation module during design/test pattern generation. The authentication information utilizing the don't care bits may be applied during test pattern generation or after the test pattern has been generated.

The message transferred/transmitted into the scan chain thus includes authentication information and scan data that is then verified on chip using some authentication operation, the response is computed, and the response is then embedded in the test pattern itself. An untrusted user would have to embed both the authentication bits as well as the expected response for those bits in the test pattern since after the pattern has been scanned in, the authentication bits are used to generate a response on chip that is compared to the expected response that was embedded in the test pattern. Advantageously, the response can change dynamically with each test pattern.

As shown in FIG. 5A, a test pattern P1, P2, P3, and P4 includes the actual test pattern, taint bits, and signature bits. The actual test patterns for a particular IC can be generated using any suitable automated test pattern generation (ATPG) tool. A set of dynamic keys can also be generated during test pattern generation using, for example, a similar methodology as that being implemented in the circuit itself from a seed value.

In detail, for each pattern Pi, there exists a corresponding signature value Si that is computed using a taint value Ti embedded in the pattern Pi. A Feistel structure-based substitution permutation network with a dynamic key schedule can be used to compute Si=Fauth(Ti, Ki), where Ki is a dynamically changing key generated from a free-running reconfigurable block and Fauth is a lightweight block cipher implemented by the substitution-permutation network. The same Pi can have different Si depending on the order in which the pattern is scanned. Since an authenticated end-user is aware of the key-schedule, they can compute Si for any Pi.

The taint bit values can be selected with various optimizations in mind. In addition, Taint bit locations are selected in such a way that for a given test pattern set, there is an equal probability of a one or zero occurring at that particular taint location. In some cases, such as shown in FIG. 5A, the taint bits are located at fixed bit locations in the test pattern. The signature bits can be generated based on the selected taint bits and the expected dynamic key. The signature bits can be disposed at fixed locations or leverage the don't care bits in the test patterns. In the example shown in FIG. 5A, the signature bits are located at certain don't care bits in the test patterns.

An optimization algorithm can be used to assign the minimum number of don't care bits that must be used to cover all the test patterns in the pattern set. For example, the optimization algorithm can involve looking at the union of all the don't care locations across all patterns and then selecting the minimum number of such bits that need to be picked for such locations so that a signature of a given size can be embedded for each test pattern. Because the don't care bit locations change for different test patterns, multiplexing can be included across all the unified signature locations. The number of bits used in $T_i$ and $S_i$ is determined by the architecture of Fauth. In the figure, it can be seen that the locations of the signature bits change for each pattern. To enable this flexibility, selection MUXes are included that specify which signature cells contain the signature bits (see e.g., selection MUXes 370 of FIG. 3). If there exist r signature cells with each signature $S_i$ being q-bits wide, then there will exist at most q such r:1 MUXes. The MUX select signals can be scanned into a separate register in parallel with the test pattern.

FIG. 5B shows an example test pattern message generation process. The test pattern message generation process can be carried out by a computing device executing instructions for automated test pattern generation with dynamic scan obfuscation capabilities or by a standalone test pattern message generation application that applies the dynamic scan obfuscation capabilities to the output of an automated test pattern generation application. Referring to FIG. 5B a test set of test patterns 552 can be generated for a particular IC 550 (e.g., using ATPG). From the test patterns 552, information 554 about don't care bits and desired security aspects can be determined. For example, information 554 can include χ, which is the minimum number of don't cares (X's) present among all patterns in the test set, also referred to as the X-budget. Information 554 can also include q, which is the established number of signature bits per test pattern. As part of the test pattern message generation process, the keys (e.g., dynamic keys k1, k2, k3, k4) and other Fauth parameters 556 are also generated.

The test patterns 552 and information 554 about the don't care bits and desired security aspects are used to determine how to embed selection bits into the test patterns. As illustrated in FIG. 5B, a signature-bit selection scheme for embedding the selection bits can be based on integer linear programming (ILP) 558 that selects the minimum number of $S_i$ locations 560 to cover all the ATPG-patterns in the test set.

For the ILP model, consider a pattern set with n patterns, each being m bits wide. Without loss of generality, a single scan chain can be assumed. A binary decision variable $x_{ij}$ can be used such that $x_{ij}=1$ if the $j^{th}$ bit of the $i^{th}$ pattern is selected, and $x_{ij}=0$ if vice-versa. Next, the X-location matrix coefficients are pre-computed from the patterns in the test set, where $c_{ij}=1$ if the $j^{th}$ of the $i^{th}$ pattern is an X and $x_{ij}=0$ otherwise. The reward score is also computed for each bit position j, where $$d_j = \sum_{i=1}^{n} c_j \forall\ 1 \le j \le m.$$

The larger the number of X's in a bit location, the more likely is the selection of that location as a signature cell. Accordingly, the X-budget can be determined. For example, a constraint can be imposed that exactly q X's, i.e., q signature bits per pattern, are selected, where $q \le \mathcal{X}$. Note that n such constraints exist, one for each pattern, $$\sum_{j=1}^{m} x_{ij} = q \forall\ 1 \le i \le n.$$

The objective here is to maximize the reward function $$\sum_{j=1}^{m} d_j \cdot \sum_{i=1}^{n} x_{ij} c_{ij}.$$

This objective function ensures that bit locations with larger number of X's per pattern are given priority. It also ensures that all X-bits in a column are selected during scoring.

After the r signature cells are allocated, the remaining (m−r) cells associated with the specified bits in the test pattern are selected 562 and considered for taint cell allocation 564. The number of taint locations (t) is fixed for all patterns in the test set. It is also ensured that (m−r)≥t, where t=6q. For each remaining scan cell location, l, let $a_l$ and $b_l$ denote the number of 0's and 1's occurring at that location across all test patterns, respectively. Because taint bits are used as inputs to the authentication block, taint cells are selected that have similar numbers of 1's and 0's. This ensures that the input to the authentication block is balanced. Thus, for each l, $\Delta l = |a_l - b_l|$ and $\mu_l = (a_l + b_l)/2$ are evaluated. Subsequently, l with the highest $\mu_l$ and lowest $\Delta l$ is chosen, thereby ensuring a balanced selection of taint bits, leading to better authentication performance for the authentication block (which may be implemented as a block cipher as described with respect to FIG. 7).

Based on the key information 556 and taint information Ti 564 (received at $F_{auth}$ block 566), the process evaluates the signature bits Si 568, which are then embedded in the don't care bits of the test pattern, resulting in authenticated patterns 570.

Table 1 shows the number of signature cells computed for various common evaluation platform (CEP) benchmarks protected using different configurations of $F_{auth}$ (and showing q=12 bits and q=16 bits).

| IP | Pattern Count | Pattern Length | Test Coverage (%) | χ | r (from ILP) q = 12 | q = 16 |
|---|---|---|---|---|---|---|
| FTR | 160 | 448 | 98.77 | 66 | 20 | 25 |
| IIR | 183 | 672 | 86.94 | 219 | 160 | 197 |
| SHA256 | 306 | 1040 | 99.86 | 267 | 27 | 32 |
| AES192 | 598 | 6854 | 98.97 | 4504 | 20 | 25 |
| RocketCore | 2183 | 43140 | 95.53 | 39856 | 23 | 23 | q: # of signature bits, r: # of signature cells, t: # of taint cells, t = 6q, thus t = 72 and 96 for 12 and 16 bit signatures, respectively; χ: X-budget.

Figure 6A:
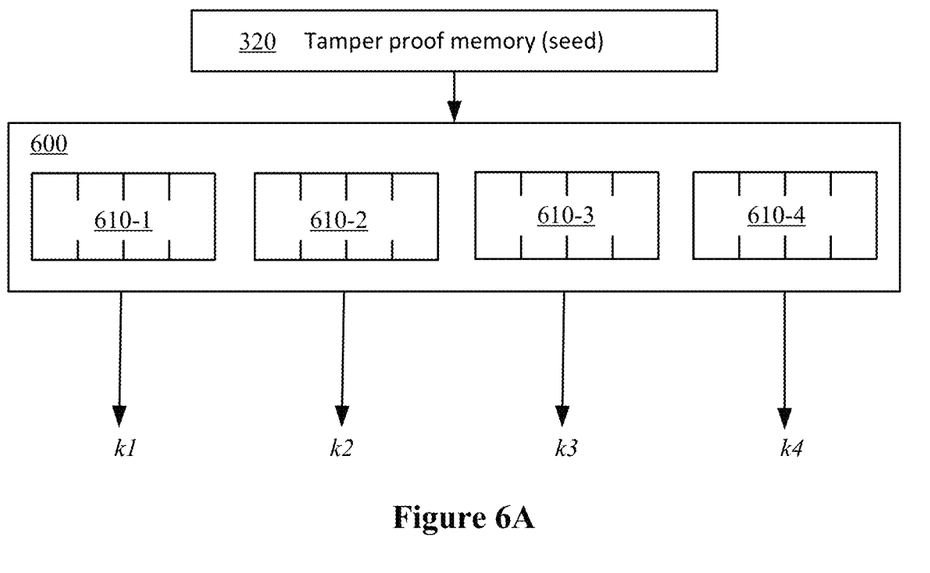
FIG. 6A shows an example reconfigurable block.
Figure 6B:
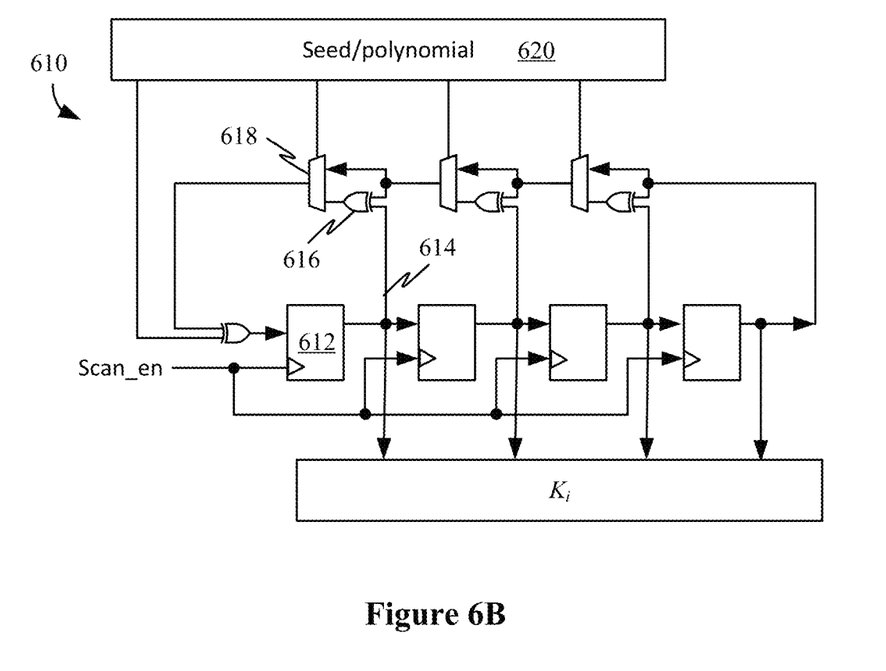
FIG. 6B shows a reconfigurable LFSR that can be used for the reconfigurable block.
Figure 7:
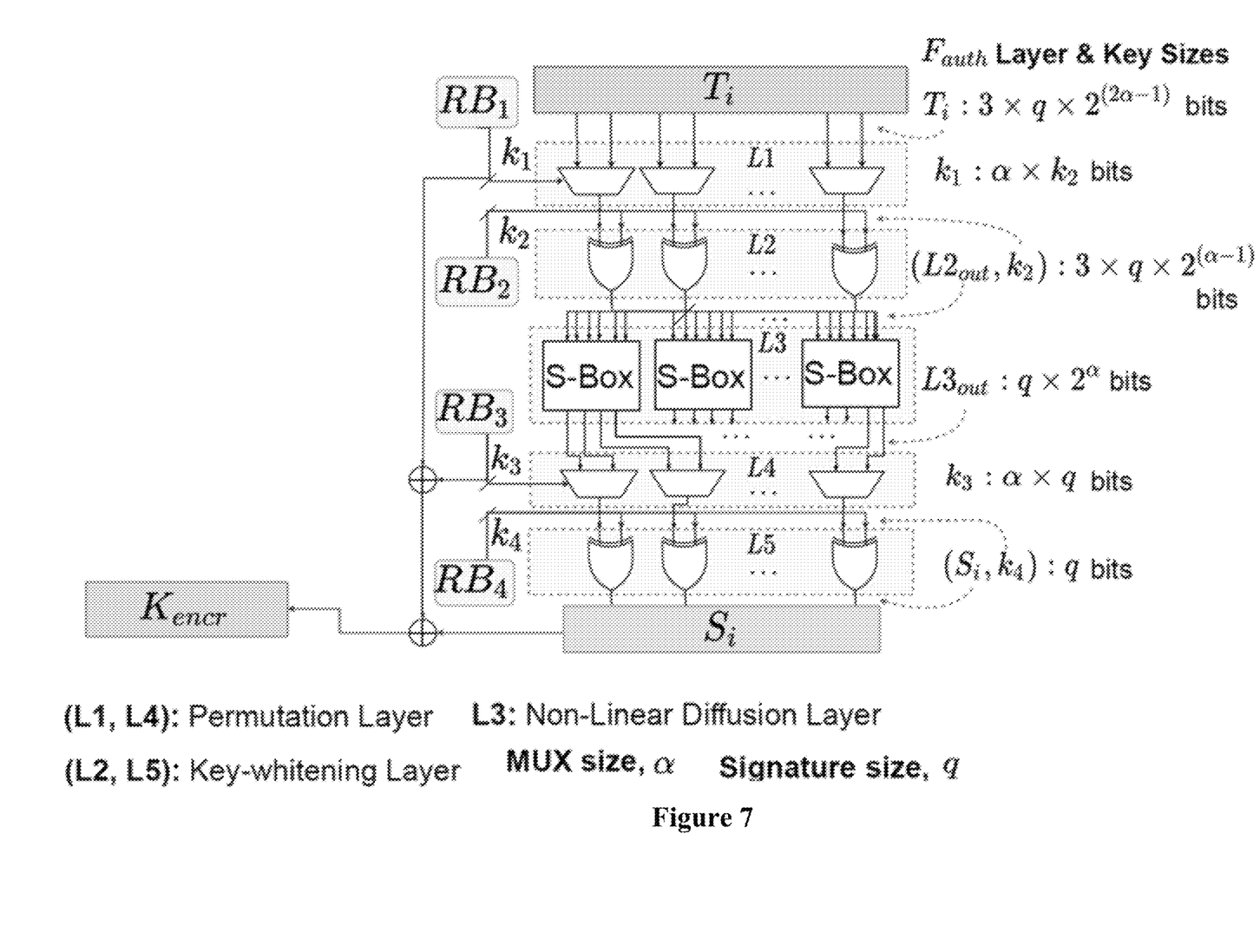
FIG. 7 shows an example authentication block.

FIG. 6A shows an example reconfigurable block; and FIG. 6B shows a reconfigurable LFSR that can be used for the reconfigurable block. Referring to FIG. 6A, a reconfigurable block 600 can include four reconfigurable LFSRs 610-1, 610-2, 610-3, 610-4. The LFSR seeds and feedback settings can be supplied from tamper-proof memory (e.g., tamper proof memory 320 of FIG. 3) and only known to authenticated users. Referring to FIG. 6B, a reconfigurable LFSR 610, which may be used to implement each of the four reconfigurable LFSRs 610-1, 610-2, 610-3, 610-4, includes a series of flip-flops 612 (e.g., shift register) with feedback from taps 614 in the register chain, which can be multiplexed (e.g., via XOR 616 and MUX 618) under control of a seed value 620 (e.g., from the tamper proof memory 320 as described with respect to FIG. 3).

Here, each XOR gate 616 of the LFSR is multiplexed with MUX 618 with the feedback coming in from a subsequent flip-flop in the LFSR 610. As mentioned above, the LFSR 610 includes reconfigurable feedback. In some cases, a reconfigurable feedback polynomial is included in the tamper proof memory to provide the configuration for the feedback. For example, depending on how the MUXs 618 are initialized, it is possible to choose which of these XOR gates 616 are part of the feedback, which is used to drive the LFSR 610. Accordingly, in such a case, the LFSR 610 can be configured across multiple possible feedback cases and the feedback state is determined by the select line of the of the MUX 618. In some cases, a standard feedback polynomial (fixed) can be used instead of a reconfigurable feedback polynomial.

In some cases, the LFSR 610 is a 16 bit LFSR. In some cases, the LFSR 610 is a 32 bit LFSR. It should be understood that while four LFSRs are described as implementing the reconfigurable block 600, the size and number of LFSRs used for the reconfigurable block can be selected based on extent of protection desired (e.g., even a single 16 or 32 bit LFSR can be difficult to brute force through with certain existing oracle-free attacks).

FIG. 7 shows an example authentication block. The authentication/encryption function can be similar to a Feistel structure-based substitution-permutation network. In FIG. 7, the function involves five layers, alternating between permutation, key whitening, and non-linear diffusion layers. In some cases, more than five layers may be cascaded. However, the five layers can offer adequate security at low overhead. When more security is needed, additional layers can be used. For example, layers L1, L2, and L3 can be repeated multiple times in series to make the cipher deeper.

Referring to FIG. 7, the function supports two rounds of permutation (L1, L4) and key whitening (L2, L5) while performing one round of non-linear diffusion using a dynamic key schedule. The sizes of L1–L5 and k1–k4 are determined based on the number of signature bits q bits per pattern) and the size of MUXes used in the permutation layers ($2^{\alpha}$: 1 MUX). Given q and $\alpha$, the parametric values of the layer and key sizes are shown. The permutation layers (L1, L4) use a network of 2:1 MUXes ($\alpha=1$) to selectively propagate half the incoming bits to the next layer. Thus, each incoming bit has an equal probability of selection based on the dynamic key used to drive its corresponding MUX select line. The key whitening layers (L2, L5) are used to encrypt intermediate data and increase the size of the key space. The diffusion layer (L3) uses several 6×4 combinational S-Boxes to perform non-linear mapping between input and output. The number of S-Boxes is given by $q \times 2^{\alpha-2}$. As $\alpha=1$ and the number of S-Boxes is an integer, q is an even value. Here, for $\alpha=1$, the number of taint bits t=6 q.

The keys (k1, k2, k3, k4) driving the permutation and key-whitening layers are generated from the authentication block (e.g., on-chip LFSRs with reconfigurable feedback as shown in FIGS. 6A and 6B). The key schedule is determined by the feedback configuration and the seed of each LFSR with reconfigurable feedback. An LFSR with reconfigurable feedback of size $\lambda$ has $\lambda-1$ MUXes in its feedback path and the size of the seed is $2\lambda-1$. The key update frequency is determined by the clock signal, which is driven by the scan_en signal, thereby updating the LFSR state and the keys dynamically for each pattern. Since the initialization seed can be changed for each IC/device, the described architecture supports a unique key sequence per device.

Let k1, k2, k3, and k4 represent the dynamic keys used in different layers, $p_i(k_i, t)$ represent the output of the ith permutation layer, and s(t) represent the output of the substitution block. Then, the authentication signature is expressed as $s=k_4 \oplus p_2(k_3, s(k_2 \oplus p_1(k_1, t)))$.

Figure 8:
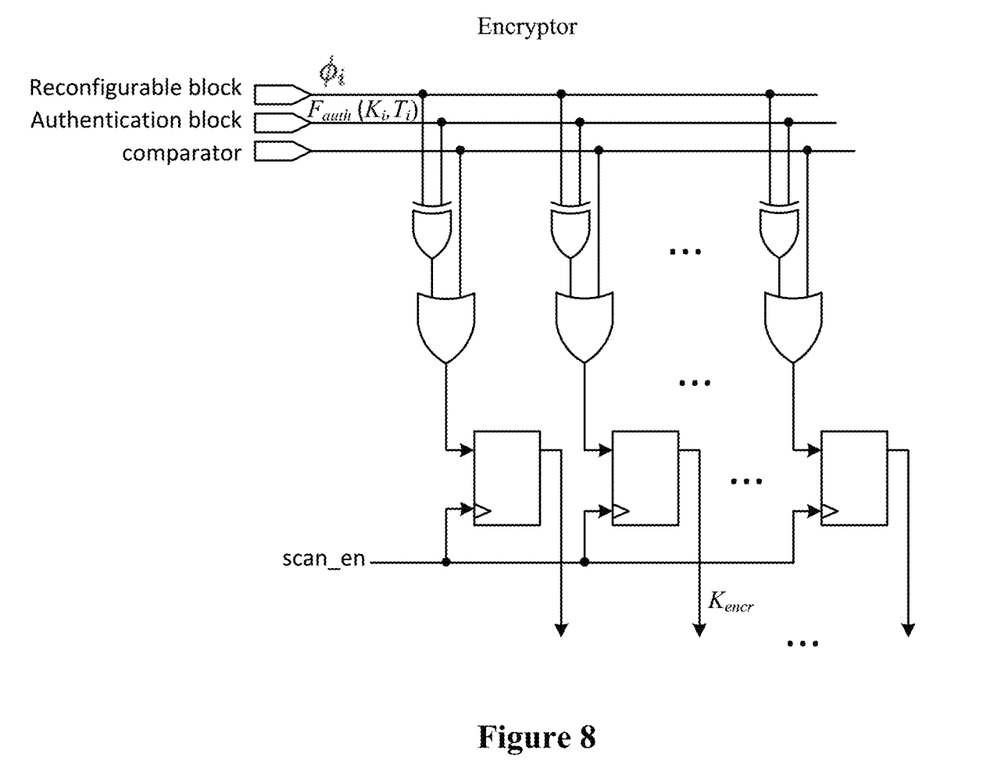
FIG. 8 shows an example encryptor.

FIG. 8 shows an example encryptor. A stream cipher can be used to dynamically encrypt scan data, for example using XOR gates (e.g., implementing the operation $\oplus$ as also shown in FIG. 3) placed in the scan chain. The scan encryption key $K_{encr}$ is generated by using Fauth (e.g., from authentication block 330 shown in FIG. 3) as a stream cipher in counter mode and can be given as $K_{encr}=F(T_i, K_i) \oplus \phi_i$, where $\phi_i$ is a dynamically changing key generated from a free-running reconfigurable block (e.g., reconfigurable block 310 shown in FIG. 3). The encrypted response is $R_{encr}=R_i \oplus K_{encr}$, where $R_i$ is the original test pattern embedded signature. In case of mismatch between the computed and embedded signatures, the encryption block (encryptor 800) generates and stores the key $K_{encr}$ used to encrypt the test response on the scan chain. During an authenticated test access, $P_i$ is scanned in with the appropriate $S_i$ embedded in it, leading to unobfuscated scan operation. An untrusted user will only be able to access the encrypted responses for the supplied pattern because the untrusted user does not have access to the dynamic keys used for authentication and encryption.

With reference to both FIGS. 7 and FIG. 8, scan responses are encrypted through XOR gates distributed uniformly across the scan chain. The encryption key is generated by a block cipher such as shown in FIG. 7 configured as a stream cipher in counter mode so that $k^{encr}=k1 \oplus k3|s$. The keys k1 and k3 are truncated to match s. If q is the size of encryption key, then the $j^{th}$ bit of the encrypted response is encrypted with all the key bits following it, i.e., $r_j^{encr}=r_j \oplus_{i=j}^q k_j^{encr}$.

As an example, consider an authentication architecture having four signature-bits. Given q=4, t=24 bits wide, keys k1 and k2 are 12 bits wide, and keys k3 and k4 are 4 bits wide. The signatures values for the same pattern containing the taint bits T=0xB12D09 (in hexadecimal) are computed for two different time-steps using k1=[0xC2F, 0xB4C], k2=[0x56A, 0x824], k3=[0x7, 0x3], and k4=[0x9, 0xD]. The resulting signatures are s=[0x4, 0xE]. These values are compared with the signature embedded within the test pattern in both the time-steps using the on-board comparator. In case of a mismatch, the following binary encryption keys are used for the failing time-steps, $k^{encr}=[1100, 0001]$.

In some cases, the lightweight non-linear scan encryption scheme described herein offers resilience against existing attacks mounted on obfuscated scan chains, while incurring less than 0.2% area overhead for large circuits.

FIG. 9 shows an example comparator. Referring to FIG. 9, the comparator can compare the authentication signature embedded in the test pattern ("test pattern embedded signature") with the one computed on-board using $F_{auth}$ ("authentication signature"). Here, the comparator includes a set of two-input XORs, each XOR coupled to receive a bit of the test pattern embedded signature from the test pattern on a scan chain and a corresponding bit of the computed authentication signature and output the result to an OR gate.

Figure 10A:
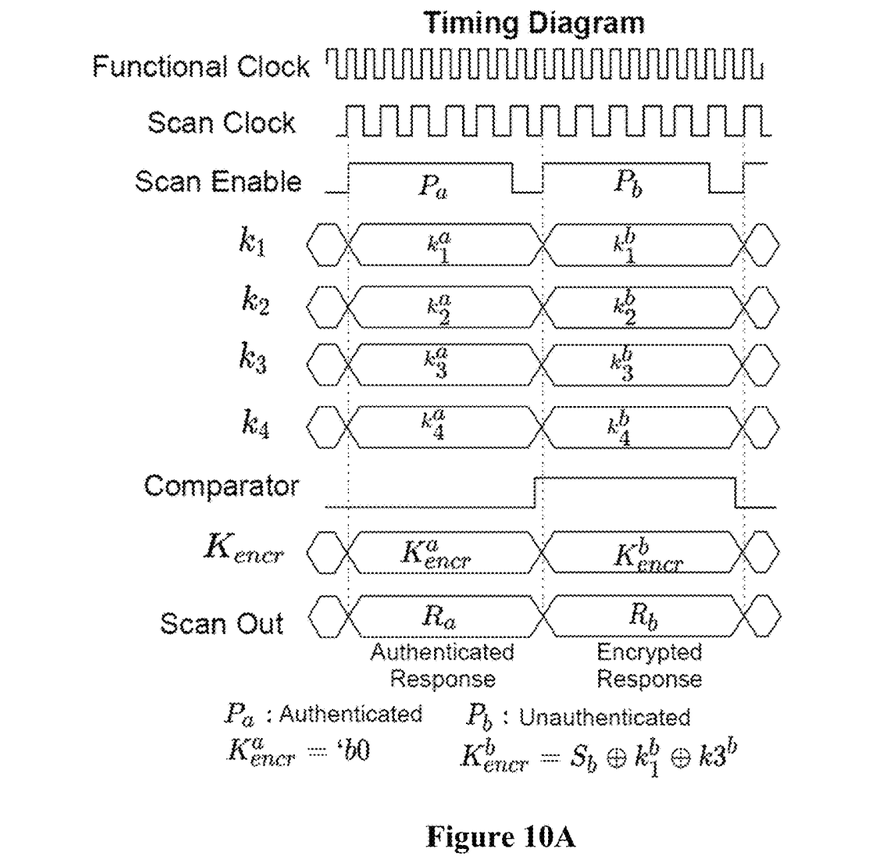
FIGS. 10A and 10B illustrate example operations.
Figure 10B:
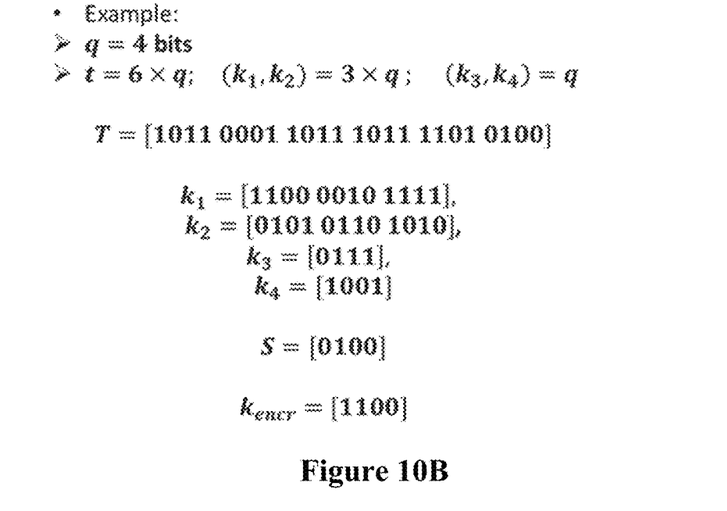

FIGS. 10A and 10B illustrate example operations. FIG. 10A illustrates a timing diagram for a first example. Referring to FIG. 10A, the functional clock, scan clock, and scan enable signals are shown. The scan enable covers two test patterns for the scan chain: Pa and Pb is shown, where these patterns have a scan chain length of 5 (as can be seen from the scan clock). The patterns would have some signature bits and some taint bits. There are four keys (k1, k2, k3, k4). In this example, Pa is authenticated (prior to the timing diagram start) and thus has the right signature bits to get authenticated. Therefore, the comparator output is 0, resulting in the scan output being considered an authenticated response and output without encryption. (e.g., OR gates as shown in FIG. 8 output 1 and $K_{encr}$ does not apply encryption). However, as can be seen in this example, Pb was not authenticated and the comparator shows an output of 1, indicating that the signature bits do not match the test response pattern. Thus, the encryptor causes encryption to occur (e.g., OR gates as shown in FIG. 8 may have a 0 on at least one output and $Kencr=S_b \oplus k_1^b \oplus k_3^b$) and an encrypted response to be output on the scan chain.

FIG. 10B shows another example. In the example of FIG. 10B, similar to the example provided in reference to FIGS. 7 and 8, q=4 bits, t=6×q=24 bits wide (and the taint bits T=1011 0001 1011 1011 1101 0100), keys k1 and k2 are 12 bits wide (3×q) (where k1=1100 0010 1111 and k2=0101 0110 1010), and keys k3 and k4 are 4 bits wide (q) (where k3=0111 and k4=1001). In this example, the computed signature is [0100]. The key used for encrypting the scan data (Kencr) is Sb⊕k1⊕k3 (as can be seen from FIG. 7) and is shown as 1100.

The described IC protection circuits can be inserted into a design and synthesized using a suitable electronic design automation tool (and stored as instructions and data structures on non-transitory computer readable media for execution by a computing device). The resulting layout files can be provided to a foundry for fabrication.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. An integrated circuit (IC) protection circuit, comprising:
a reconfigurable block that receives a seed value from a tamper-proof memory and generates a dynamic key;
an authentication block that receives the dynamic key from the reconfigurable block and taint bits from a scan chain to generate an authentication signature, wherein the authentication block is a block cipher implemented by a substitution permutation (SP) network, and wherein the authentication block comprises:
a first permutation layer coupled to receive the taint bits and a first dynamic key from the reconfigurable block;
a first key-whitening layer coupled to receive outputs of the first permutation layer and a second dynamic key from the reconfigurable block;
a non-linear diffusion layer coupled to receive outputs of the first key-whitening layer;
a second permutation layer coupled to receive outputs of the non-linear diffusion layer and a third dynamic key from the reconfigurable block; and
a second key-whitening layer coupled to receive outputs of the second permutation layer and a fourth dynamic key from the reconfigurable block, the second key-whitening layer outputting the authentication signature;
an encryptor that encrypts a test pattern response on the scan chain if a mismatch is found between the authentication signature and a test pattern embedded signature; and
a comparator coupled to receive the authentication signature from the authentication block and the test pattern embedded signature from the scan chain and output a signal to the encryptor the signal indicating whether or not there is the mismatch between the authentication signature and the test pattern embedded signature.

2. The IC protection circuit of claim 1, further comprising:
one or more multiplexors (MUXs) coupled to the scan chain to select bits corresponding to the test pattern embedded signature and output the test pattern embedded signature to the comparator.

3. The IC protection circuit of claim 2, wherein the bits corresponding to the test pattern embedded signature are located at don't care bit locations of a test pattern.

4. The IC protection circuit of claim 1, wherein the comparator comprises an XOR comparator.

5. The IC protection circuit of claim 1, wherein the encryptor comprises:
a first XOR coupled to receive the dynamic key from the reconfigurable block and the authentication signature from the authentication block as inputs;
a first OR coupled to receive output from the first XOR and output of the comparator as inputs; and
a first flip-flop coupled to receive output of the first OR as input and output an encryption key according to a scan enable signal.

6. The IC protection circuit of claim 1, wherein the encryptor receives a second set of dynamic keys from the reconfigurable block for performing encryption.

7. The IC protection circuit of claim 1, wherein the reconfigurable block comprises:
one or more linear shift feedback registers (LFSRs).

8. The IC protection circuit of claim 1, further comprising:
a first XOR coupled to receive the first dynamic key and the third dynamic key as inputs; and
a second XOR coupled to receive an output of the first XOR and the authentication signature to output an encryption key,
wherein the encryptor is coupled to receive the encryption key output from the second XOR.

9. The IC protection circuit of claim 1, wherein the taint bits are located at fixed bit locations in a test pattern loaded onto the scan chain.

10. The IC protection circuit of claim 1, wherein a number of the test pattern embedded signature bits is equal to or less than a number of don't care bits in a test pattern.

11. An integrated circuit (IC) protection circuit, comprising:
a reconfigurable block that receives a seed value from a tamper-proof memory and generates a dynamic key;
an authentication block that receives the dynamic key from the reconfigurable block and taint bits from a scan chain to generate an authentication signature;
an encryptor that encrypts a test pattern response on the scan chain if a mismatch is found between the authentication signature and a test pattern embedded signature; and
a comparator coupled to receive the authentication signature from the authentication block and the test pattern embedded signature from the scan chain and output a signal to the encryptor the signal indicating whether or not there is the mismatch between the authentication signature and the test pattern embedded signature,
wherein the taint bits are selected for a test pattern on the scan chain to have an equal probability of a one or a zero occurring at a particular bit location, wherein the taint bits are selected to have the equal probability by evaluating, for each scan cell location, $\Delta l = |a_l - b_l|$ and $\mu_l = (a_l + b_l)/2$ to determine the scan cell locations with the highest $\mu_l$ and lowest $\Delta l$, where $a_l$ is a number of 0's occurring at that scan cell location across all test patterns and $b_l$ is a number of 1's occurring at that scan cell location across all test patterns.

12. The IC protection circuit of claim 11, wherein bit locations for the test pattern are determined after allocation of test pattern embedded signature bits in the test pattern, wherein a number of taint locations is fixed for all test patterns in a test set and the number of taint locations is larger than a number of the test pattern embedded signature bits.

13. The IC protection circuit of claim 12, wherein the number of taint locations is six times the number of the test pattern embedded signature bits.

14. The IC protection circuit of claim 11, further comprising:
one or more multiplexors (MUXs) coupled to the scan chain to select bits corresponding to the test pattern embedded signature and output the test pattern embedded signature to the comparator.

15. The IC protection circuit of claim 14, wherein the bits corresponding to the test pattern embedded signature are located at don't care bit locations of a test pattern.

16. The IC protection circuit of claim 11, wherein the comparator comprises an XOR comparator.

17. The IC protection circuit of claim 11, wherein the encryptor comprises:
- a first XOR coupled to receive the dynamic key from the reconfigurable block and the authentication signature from the authentication block as inputs;
- a first OR coupled to receive output from the first XOR and output of the comparator as inputs; and
- a first flip-flop coupled to receive output of the first OR as input and output an encryption key according to a scan enable signal.

18. The IC protection circuit of claim 11, wherein the encryptor receives a second set of dynamic keys from the reconfigurable block for performing encryption.

19. The IC protection circuit of claim 11, wherein the reconfigurable block comprises:
- one or more linear shift feedback registers (LFSRs).

20. The IC protection circuit of claim 11, wherein a number of the test pattern embedded signature bits is equal to or less than a number of don't care bits in a test pattern.

* * * * *